United States Patent
Song et al.

(10) Patent No.: US 10,935,608 B2
(45) Date of Patent: Mar. 2, 2021

(54) APPARATUS AND METHOD FOR ESTIMATING STATE OF BATTERY

(71) Applicant: Samsung Electronics Co., Ltd., Suwon-si (KR)

(72) Inventors: Tae Won Song, Yongin-si (KR); Sang Do Park, Seoul (KR); Tae Jung Yeo, Suwon-si (KR); Jin Ho Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 432 days.

(21) Appl. No.: 15/405,650

(22) Filed: Jan. 13, 2017

(65) Prior Publication Data

US 2017/0205469 A1 Jul. 20, 2017

(30) Foreign Application Priority Data

Jan. 14, 2016 (KR) .................. 10-2016-0004902

(51) Int. Cl.
| | | |
|---|---|---|
| *G01R 31/392* | (2019.01) | |
| *G01R 31/367* | (2019.01) | |
| *G01R 31/382* | (2019.01) | |
| *H01M 10/48* | (2006.01) | |

(52) U.S. Cl.
CPC ......... *G01R 31/392* (2019.01); *G01R 31/367* (2019.01); *G01R 31/382* (2019.01); *H01M 10/48* (2013.01)

(58) Field of Classification Search
CPC .................................................. G01R 31/3679
See application file for complete search history.

(56) References Cited

U.S. PATENT DOCUMENTS

| | | | |
|---|---|---|---|
| 8,395,519 B2 | 3/2013 | Cassidy | |
| 8,849,598 B2* | 9/2014 | Mingant | G01R 31/389 702/63 |
| 2011/0027621 A1* | 2/2011 | Deane | H01M 10/4235 429/7 |
| 2011/0077880 A1* | 3/2011 | Gering | G01R 31/3679 702/63 |
| 2013/0066573 A1* | 3/2013 | Bond | G01R 31/3679 702/63 |
| 2014/0278167 A1* | 9/2014 | Frost | G01R 31/3624 702/63 |
| 2014/0350877 A1* | 11/2014 | Chow | G01R 31/3624 702/63 |
| 2015/0120225 A1 | 4/2015 | Kim | |
| 2015/0153418 A1 | 6/2015 | Prenninger et al. | |

(Continued)

FOREIGN PATENT DOCUMENTS

| | | |
|---|---|---|
| JP | 8-194037 A | 7/1996 |
| JP | 2006-12761 A | 1/2006 |

(Continued)

*Primary Examiner* — Raymond L Nimox
(74) *Attorney, Agent, or Firm* — NSIP Law

(57) ABSTRACT

Apparatus and method for estimating a state of a battery is provided. According to one aspect, a battery state estimation apparatus includes a state of health (SOH) estimator configured to estimate SOH of a battery based on degradation of the battery and the data acquired from the battery, and a state of charge (SOC) estimator configured to estimate the SOC of the battery based on the SOH of the battery.

18 Claims, 9 Drawing Sheets

(56) References Cited

U.S. PATENT DOCUMENTS

| | | | | |
|---|---|---|---|---|
| 2015/0349385 A1* | 12/2015 | Hu | ................... | G01R 31/3651 |
| | | | | 429/91 |
| 2016/0033582 A1* | 2/2016 | You | ................... | G01R 31/3637 |
| | | | | 324/427 |
| 2016/0131715 A1* | 5/2016 | Sung | ................. | G01R 31/3651 |
| | | | | 702/63 |
| 2016/0202324 A1* | 7/2016 | Biletska | ............. | G01R 31/3651 |
| | | | | 702/63 |
| 2017/0285107 A1* | 10/2017 | Gholam-Abbas | ......................... | |
| | | | | G01R 31/3606 |

FOREIGN PATENT DOCUMENTS

| | | | |
|---|---|---|---|
| JP | 4038788 | B2 | 11/2007 |
| JP | 2014-127341 | A | 7/2014 |
| KR | 10-1282687 | B1 | 7/2013 |

* cited by examiner

APPARATUS AND METHOD FOR ESTIMATING STATE OF BATTERY

CROSS-REFERENCE TO RELATED APPLICATION(S)

This application claims the benefit under 35 U.S.C. § 119(a) of Korean Patent Application No. 10-2016-0004902, filed on Jan. 14, 2016, in the Korean Intellectual Property Office, the entire disclosure of which is incorporated herein by reference for all purposes.

BACKGROUND

1. Field

The following description relates to a technology for estimating a state of a battery in a battery management system.

2. Description of Related Art

A state of a battery is estimated by various methods, such as a current integration method (Ah method or coulomb counting method), a voltage measurement method, or a resistance measurement method. The current integration method (Ah method or coulomb counting method) is a method of estimating a state of charge (SOC) by reflecting a used capacity from a relation between a used current and time The voltage measurement method is a method of estimating a state of a battery from a relation between an open circuit voltage (OCV) and the SOC measured in advance by the OCV of a battery. The resistance measurement method is a method of estimating a state of a battery from a relation between an internal resistance of the battery and the SOC.

Capacity fade of a battery used in estimating a state of the battery may be affected by a state of health (SOH) of the battery, but a degradation model which takes individual degradation factors into consideration may not be able to take multiple interactions between the degradation factors into consideration.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In one general aspect, there is provided apparatus to estimate a state of a battery, the apparatus including a processor configured to estimate a state of health (SOH) of the battery due to degradation of the battery based on data acquired from the battery, and estimate a state of charge (SOC) of the battery based on the SOH of the battery.

The processor may include a state of health (SOH) estimator configured to estimate the SOH of the battery due to the degradation of the battery based on the data acquired from the battery, and a state of charge (SOC) estimator configured to estimate the SOC of the battery based on the SOH of the battery.

The apparatus may include a data collector configured to collect any one or any combination of a voltage, a current, a temperature, a current rate, and charge/discharge cycle of the battery.

The SOH estimator may apply the collected data to a pre-learned data analysis technique to estimate the SOH of the battery.

The data analysis technique may consider a degradation level of operation of the battery based on any one or any combination of a neural network and deep learning.

The SOC estimator may be configured to update a parameter of an electrode of the battery based on the SOH of the battery and to estimate the SOC of the battery based on the updated parameter.

The parameter of the electrode may include any one or any combination of an electrode volume ratio, a film resistance, and a particle size of an electrode.

The SOC estimator may estimate a parameter update cycle based on any one or any combination of a battery capacity, a battery operation time, a charge/discharge time of the battery, and a number of charge/discharge cycles of the battery.

The SOC estimator may be configured to apply the updated parameter to an electrochemical model to estimate a battery state including potential and density distribution.

The degradation of the battery may be estimated based on operation data of the battery.

In another general aspect, there is provided a method to estimate a state of a battery, the method including estimating a state of health (SOH) of the battery due to degradation of the battery based on data acquired from the battery, and estimating a state of charge (SOC) of the battery based on the SOH of the battery.

The method may include collecting data any one or any combination of a voltage, a current, a temperature, a current rate, and charge/discharge cycle of the battery.

The estimating of the SOH of the battery may include applying the collected data to a pre-learned data analysis technique to estimate the SOH of the battery.

The data analysis technique may consider a degradation level of operation of the battery based on any one or any combination of a neural network and deep learning.

The estimating of the SOC of the battery may include estimating a parameter update cycle based on any one or any combination of a battery capacity, a battery operation time, a charge/discharge time of the battery, and a number of charge/discharge cycles of the battery.

The estimating of the SOC of the battery may include updating a parameter of an electrode by reflecting the SOH of the battery and estimating the SOC of the battery based on the updated parameter.

The parameter of the electrode may include any one or any combination of an electrode volume ratio, a film resistance, and a particle size of an electrode.

The estimating of the SOC of the battery may include applying the updated parameter to an electrochemical model to estimate a battery state comprising potential and density distribution.

Other features and aspects will be apparent from the following detailed description, the drawings, and the claims.

Figure 1:
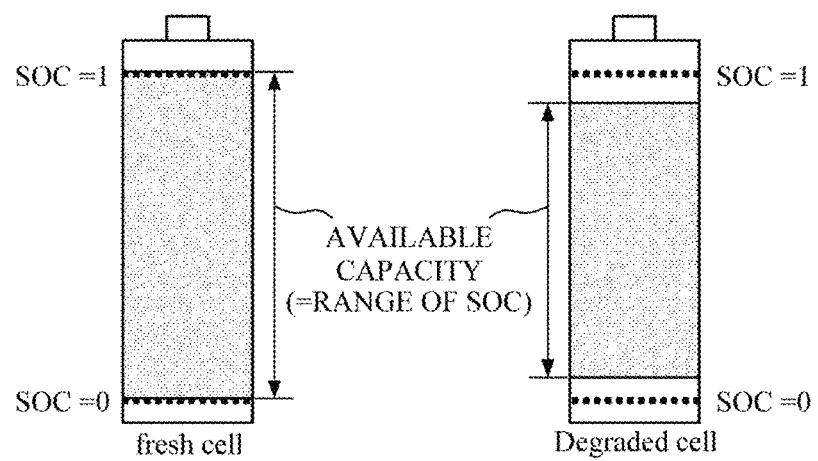
FIG. 1 is a diagram illustrating an example of an available capacity of a battery and a state of charge (SOC) region of a degraded battery cell.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or apparatuses described herein. However, various changes, modifications, and equivalents of the methods, apparatuses, and/or apparatuses described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or apparatuses described herein that will be apparent after an understanding of the disclosure of this application.

FIG. 1 is a diagram illustrating an example of an available capacity of a battery and a state of charge (SOC) region of a degraded battery cell. FIG. 1 shows change in an available capacity between a fresh cell and a degraded cell. When a battery is degraded due to an operation of the battery, an available capacity of the degraded cell is smaller than an available capacity of a fresh cell. When the battery is operated for a long time, the available capacity may decrease due to degradation of the battery. Accordingly, a better estimation of an SOC of the battery can be made based on a decrease in a state of health (SOH) of the battery due to the degradation of the battery.

Figure 2:
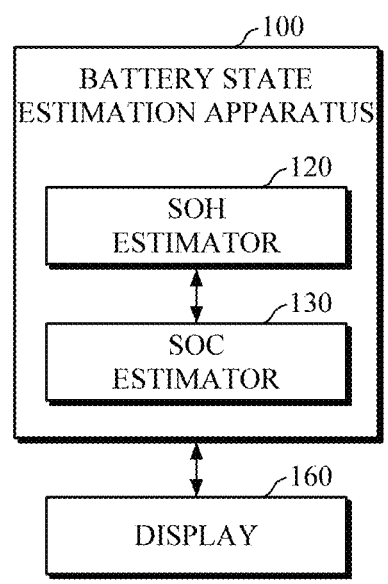
FIG. 2 is a diagram of a battery state estimation apparatus according to an embodiment.

FIG. 2 is a diagram illustrating an example of a battery state estimation apparatus 100. Referring to FIG. 2, the battery state estimation apparatus 100 includes an SOH estimator 120, an SOC estimator 130, and a display 160.

In an example, the SOH estimator 120 estimates an SOH of a battery due to degradation of the battery based on data acquired from the battery. Although battery capacity fade can be estimated using a standard charge/discharge cycle, capacity fade estimated using the standard charge/discharge cycle under limited environmental conditions and capacity fade estimated under actual operational conditions when each battery is separately operated may be different. In addition, degradation factors of a battery may act in combination, and battery capacity fade needs to be estimated in consideration of interactions between all of the degradation factors.

According to an embodiment, the SOH estimator 120 takes various degradation factors into consideration to estimate a decrease in an SOH of a battery due to degradation of the battery. In an example, the degradation factors are taken from battery operation data actually measured in each battery. For example, when the SOH of the battery is estimated in consideration of the various degradation factors from the data according to operation of the battery, a change in available capacity in an actual battery operation environment can more accurately be estimated and an error in estimating a state of the battery can be decreased.

In an example, the SOC estimator 130 estimates an SOC of the battery based on the estimated SOH of the battery. In addition, the SOC estimator 130 estimates one or more battery states from a potential and a density distribution of the battery. For example, the SOC estimator 130 calculates a parameter related to an electrode based on the estimated SOH of the battery and applies the parameter related to an electrode to an electrochemical model to estimate the SOC of the battery.

In an example, the decrease in the SOH of a battery due to degradation of the battery is displayed on the display 160. In another example, the SOC of the battery is displayed on the display 160. In an example, the display 160 may be a physical structure that includes one or more hardware components that provide the ability to render a user interface and/or receive user input. The display 160 can encompass any combination of display region, gesture capture region, a touch sensitive display, and/or a configurable area. In an example, the display 160 can be embedded in the battery state estimation apparatus 100. In an example, the display 160 is an external peripheral device that may be attached to and detached from the battery management apparatus 100. The display 160 may be a single-screen or a multi-screen display. A single physical screen can include multiple displays that are managed as separate logical displays permitting different content to be displayed on separate displays although part of the same physical screen. The display 160 may also be implemented as an eye glass display (EGD), which includes one-eyed glass or two-eyed glasses.

Figure 3:
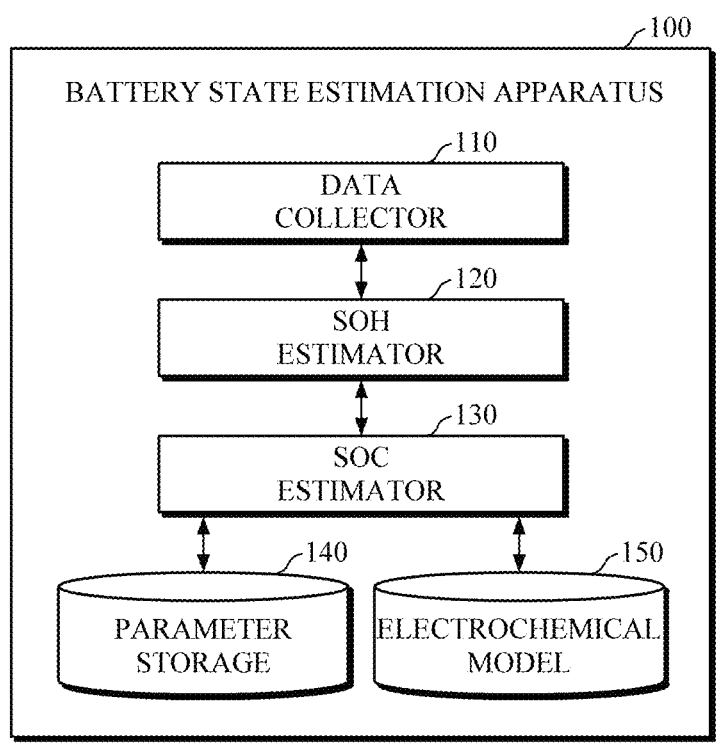
FIG. 3 is a diagram of the battery state estimation apparatus according to an embodiment.

FIG. 3 is a diagram illustrating an example of the battery state estimation apparatus 100. Referring to FIG. 3, the battery state estimation apparatus 100 includes a data collector 110, the SOH estimator 120, the SOC estimator 130, a parameter storage 140, and an electrochemical model 150. In addition to the description of FIG. 3 below, the above descriptions of FIG. 2, are also applicable to FIG. 3, and are incorporated herein by reference. Thus, the above description may not be repeated here In an example, the data collector 110 collects data sensed by a sensor and data related to a battery operation environment. For example, the data collector 110 collects data such as, for example, voltages, currents, temperatures, C-rates, an amount change of a charge/discharge cycle, and the number of repetitions of charging and discharging. In an example, the data collector 110 collects this data by either sensing or measuring the data.

In an example, the SOH estimator 120 applies the data collected by the data collector 110 to a pre-learned data analysis technique to estimate the SOH of the battery. For example, the data analysis technique may be a technique, which takes a degradation level of the battery into consideration from data according to operation of the battery based on one or more of a neural network and deep learning.

According to an embodiment, the data analysis technique based on the neural network may include a plurality of hidden layers between an input layer and an output layer. The data analysis technique based on the neural network may set the collected data, such as, for example, voltages, currents, temperatures, C-rates, a change amount of a charge/discharge cycle, the number of repetitions of charging and discharging, as input data or weighted value parameters between the plurality of hidden layers and may pre-learn to estimate capacity fade in consideration of multiple degradation factors of a battery according to actual operation of the battery. The data analysis technique based on the neural network may be an analysis model or a calculation model learned and generated inside or outside a battery management system (BMS).

The SOH estimator 120 may input the data collected by the data collector 110 into the data analysis technique based on the neural network and may apply the pre-learned data analysis technique based on the neural network to determine the SOH of the battery in consideration of various degradation factors. For example, capacity fade of a battery is estimated in consideration of an actual degradation level of the battery according to long-term operation of the battery, and from this, the SOH of the battery may accurately be estimated.

The SOC estimator 130 estimates an SOC of the battery based on the estimated SOH of the battery. In addition, the SOC estimator 130 may estimate one or more battery states from a potential and a density distribution from the estimated SOH of the battery.

For example, the SOC estimator 130 may calculate a parameter related to an electrode of the battery from the estimated SOH of the battery, such as, for example, an electrode volume ratio, a film resistance, and a particle size of an electrode. The SOC estimator 130 may update the parameter related to the electrode by storing the calculated parameter related to the electrode in the parameter storage 140. Meanwhile, other than the embodiment described above, there may be various types of parameters related to an electrode.

Here, the updated parameter may be a value in which an SOH of a battery due to degradation of the battery is considered, and the SOC estimator 130 may apply the updated parameter to the electrochemical model 150 to estimate the SOC of the battery.

In addition, a decrease in the SOH of the battery due to degradation of the battery may be exhibited over a long period of time as the battery is operated, and the SOC estimator 130 may estimate an update cycle in which the parameter related to an electrode is updated according to a predetermined standard. For example, the SOC estimator 130 may estimate a parameter update cycle based on one or combinations of a battery capacity, a battery operation time, a charge/discharge time, and the number of charge/discharge cycles. For example, the SOC estimator 130 may estimate the parameter update cycle as one day, one week, one month, may estimate the parameter update cycle according to the number of charge/discharge cycles, and may preset the parameter update cycle by combining predetermined standards.

In an example, the battery state estimation apparatus 100 may be embedded in or interoperate with various digital devices such as, for example, a mobile phone, a cellular phone, a smart phone, a personal computer (PC), a laptop, a notebook, a subnotebook, a netbook, or an ultra-mobile PC (UMPC), a tablet personal computer (tablet), a phablet, a mobile internet device (MID), a personal digital assistant (PDA), an enterprise digital assistant (EDA), a digital camera, a digital video camera, a portable game console, an MP3 player, a portable/personal multimedia player (PMP), a handheld e-book, an ultra mobile personal computer (UMPC), a portable lab-top PC, a global positioning system (GPS) navigation, a personal navigation device or portable navigation device (PND), a handheld game console, an e-book, and devices such as a high definition television (HDTV), an optical disc player, a DVD player, a Blue-ray player, a setup box, robot cleaners, a home appliance, content players, communication systems, image processing systems, graphics processing systems, other consumer electronics/information technology (CE/IT) device, or any other device capable of wireless communication or network communication consistent with that disclosed herein. The digital devices may be may be embedded in or interoperate with a smart appliance, an intelligent vehicle, an electric vehicle, a hybrid vehicle, a smart home environment, or a smart building environment.

The digital devices may also be implemented as a wearable device, which is worn on a body of a user. In one example, a wearable device may be self-mountable on the body of the user, such as, for example, a ring, a watch, a pair of glasses, glasses-type device, a bracelet, an ankle bracket, a belt, a necklace, an earring, a headband, a helmet, a device embedded in the cloths, or as an eye glass display (EGD), which includes one-eyed glass or two-eyed glasses. In another non-exhaustive example, the wearable device may be mounted on the body of the user through an attaching device, such as, for example, attaching a smart phone or a tablet to the arm of a user using an armband, incorporating the wearable device in a cloth of the user, or hanging the wearable device around the neck of a user using a lanyard.

Figure 4:
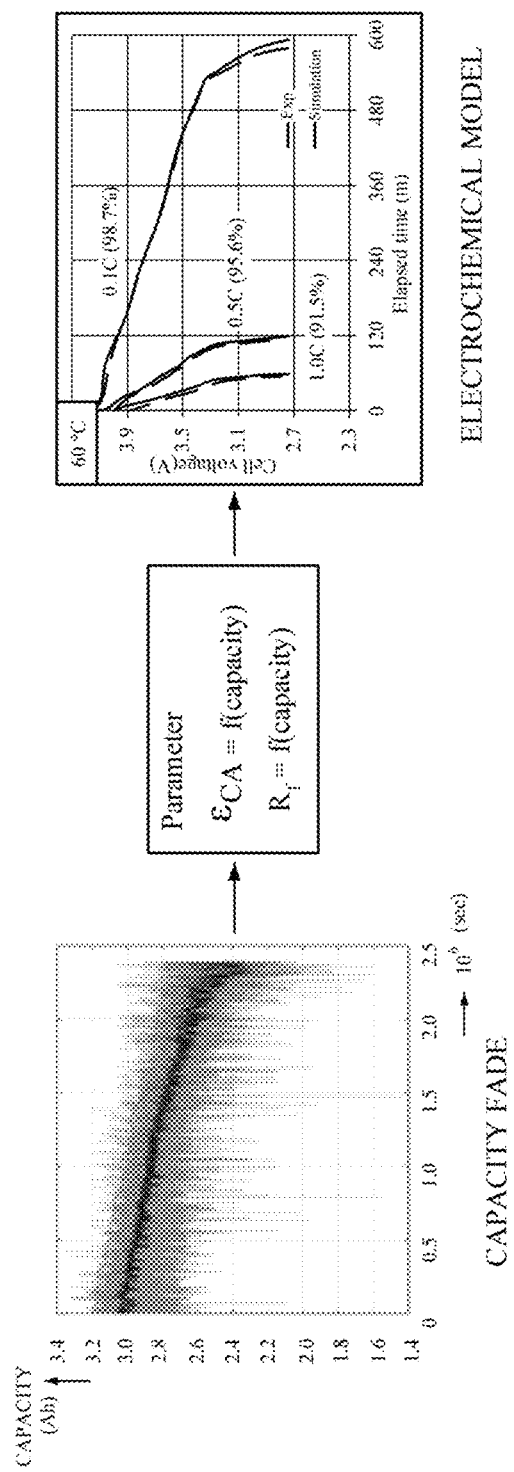
FIG. 4 is a diagram illustrating an example of estimating a state of a battery based on a state of health (SOH) of the battery.

FIG. 4 is a diagram illustrating an example of estimating a state of a battery based on an SOH of the battery. A graph at the left in FIG. 4 illustrates an example capacity fade estimated by applying data collected while operating the battery to the data analysis technique based on the neural network. In an example, the estimated capacity fade is estimated from data actually measured according to an actual operation environment of the battery and is a value in which multiple degradation factors of the battery are considered.

In an example, the battery state estimation apparatus 100 calculates a parameter related to an electrode including an electrode volume ratio ($\varepsilon_{CA}$) and a film resistance ($R_f$) from the estimated SOH of the battery. The battery state estimation apparatus 100 stores a calculated parameter in the parameter storage 140 and update the parameter related to an electrode to be a value in which a degradation level of the battery is considered. A graph at the right in FIG. 4 illustrates an example showing actually-measured values (Exp) and simulated values (Simulation) of the SOC of the battery when the updated parameter is applied to the electrochemical model 150. In an example, the simulated values, which are values of the SOC of the battery estimated in consideration of the degradation level of the battery by the battery state estimation apparatus 100, are similar to the actually-measured values of the SOC of the battery.

Figure 5A:
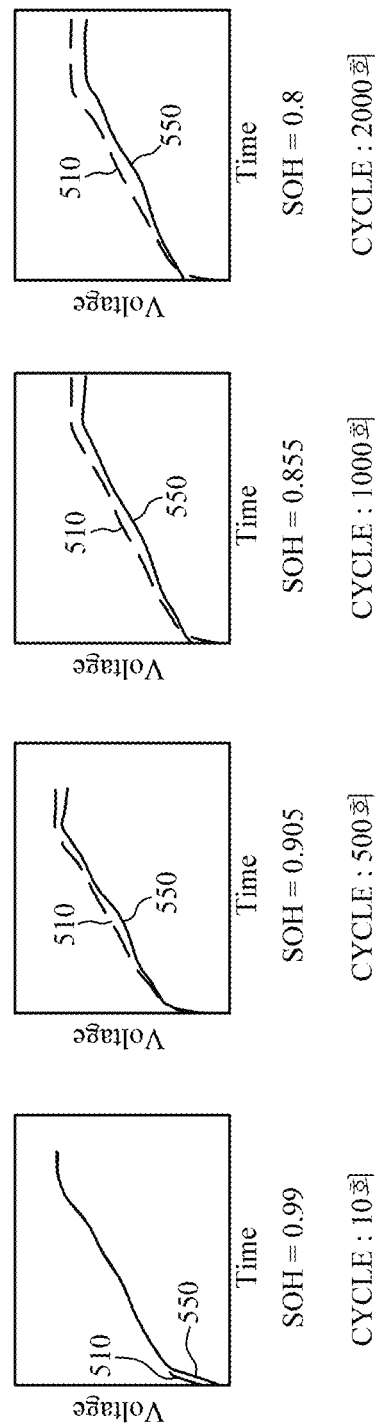
FIG. 5A is a diagram illustrating examples of battery SOC graphs when an SOC of a battery is estimated without considering degradation of the battery.
Figure 5B:
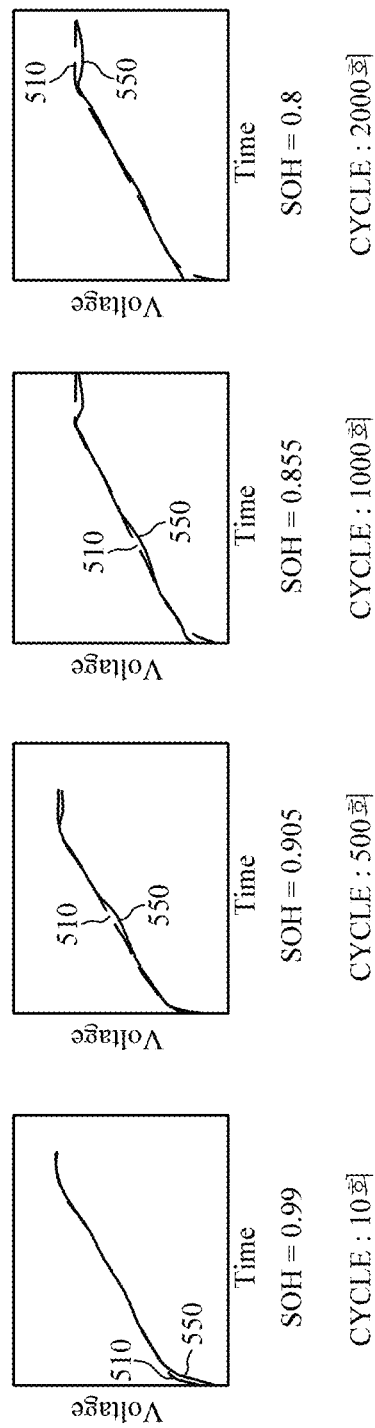
FIG. 5B is a diagram illustrating examples of battery SOC graphs when an SOC of a battery is estimated using the battery state estimation apparatus (100).

FIG. 5A is a diagram illustrating examples of battery SOC graphs when an SOC of a battery is estimated without considering degradation of the battery. FIG. 5B is a diagram illustrating examples of battery SOC graphs when an SOC of a battery is estimated using the battery state estimation apparatus 100. Referring to FIG. 5A, when the SOC of the battery is estimated without considering degradation of the battery, a difference may be generated between an actually-measured value of the SOC of the battery and a simulated value which is an estimated value of a state of the battery. The difference may gradually become larger according to a degradation level of the battery.

Referring to FIGS. 5A and 5B, when the number of charge/discharge cycles of the battery increases from 10 to 500, 1000, and 2000 according to operation of the battery, the SOH of the battery may decrease and may be 0.99, 0.905, 0.855, and 0.8, respectively. In FIG. 5A, when the SOC of the battery is estimated without considering degradation of the battery, an error between a graph 510 in which the SOC of the battery is actually measured and a simulation graph 550 in which the SOC of the battery is estimated may increase with the increase in the number of charge/discharge cycles of the battery.

Referring to FIG. 5B, when the SOC of the battery is estimated by the battery state estimation apparatus 100 while reflecting degradation of the battery, even when the number of charge/discharge cycles increases and the degradation level of the battery gradually becomes higher, the error between the simulation graph 550 in which the SOC of the battery is estimated and the graph 510 in which the SOC of the battery is actually measured is not large.

Figure 6:
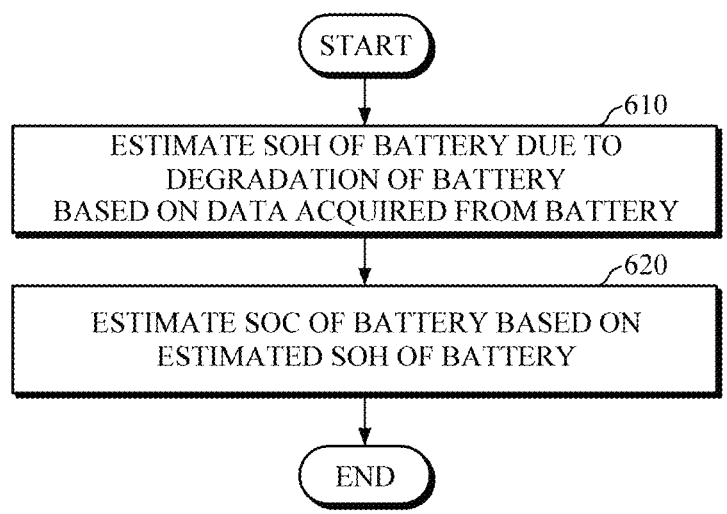
FIG. 6 is a diagram illustrating an example of a battery state estimation method.

FIG. 6 is a diagram illustrating an example of a battery state estimation method. The operations in FIG. 6 may be performed in the sequence and manner as shown, although the order of some operations may be changed or some of the operations omitted without departing from the spirit and scope of the illustrative examples described. Many of the operations shown in FIG. 6 may be performed in parallel or concurrently. In addition to the description of FIG. 6 below, the above descriptions of FIGS. 1-5B, are also applicable to FIG. 6, and are incorporated herein by reference. Thus, the above description may not be repeated here.

In S610, the SOH estimator 120 estimates an SOH of a battery due to degradation of the battery based on data acquired from the battery. According to an embodiment, the SOH estimator 120 uses a data analysis technique capable of taking various degradation factors into consideration to estimate capacity fade of the battery in which degradation of the battery is reflected from battery operation data actually measured in each battery. When capacity fade of the battery is estimated in consideration of the various degradation factors from the actually-measured data, a change in available capacity in an actual battery operation environment can more accurately be estimated, and thus an error in estimating a battery state can be reduced.

In S620, the SOC estimator 130 estimates an SOC of the battery based on the estimated SOH of the battery. In addition, the SOC estimator 130 estimates one or more of a potential and density distribution in the battery. For example, the SOC estimator 130 calculates a parameter related to an electrode based on the estimated SOH of the battery and applies the parameter related to an electrode to the electrochemical model to estimate the SOC of the battery.

Figure 7:
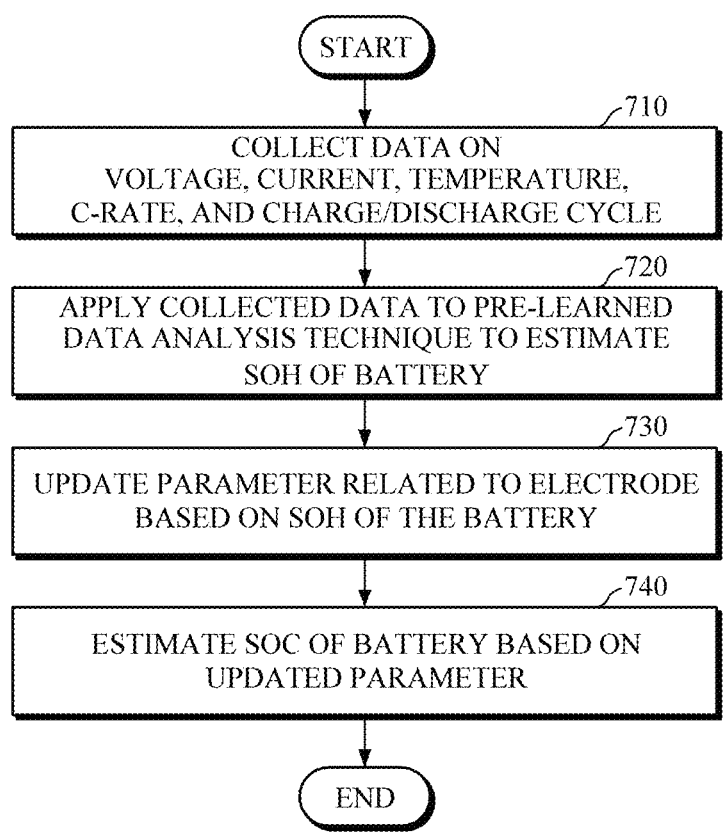
FIG. 7 is a diagram illustrating an example of the battery state estimation method.

FIG. 7 is a diagram illustrating an example of the battery state estimation method. In an example, the battery state is estimated using the battery state estimation apparatus 100 of FIG. 3. The operations in FIG. 7 may be performed in the sequence and manner as shown, although the order of some operations may be changed or some of the operations omitted without departing from the spirit and scope of the illustrative examples described. Many of the operations shown in FIG. 7 may be performed in parallel or concurrently. In addition to the description of FIG. 7 below, the above descriptions of FIGS. 1-6, are also applicable to FIG. 7, and are incorporated herein by reference. Thus, the above description may not be repeated here.

In S710, the data collector 110 collects data sensed by a sensor and data related to a battery operation environment. For example, the data collector 110 may collect data such as, for example, voltages, currents, temperatures, C-rates, a change amount of a charge/discharge cycle, and the number of repetitions of charging and discharging by sensing or measuring.

In S720, the SOH estimator 120 may apply the data collected by the data collector 110 to the pre-learned data analysis technique to estimate the SOH of the battery. For example, the data analysis technique may be an analysis technique, which takes a degradation level of the battery into consideration from data according to operation of the battery based on one or more of a neural network and deep learning.

According to an embodiment, the data analysis technique based on the neural network may include a plurality of hidden layers between an input layer and an output layer. The data analysis technique based on the neural network may set the collected data, such as, voltages, currents, temperatures, C-rates, a change amount of a charge/discharge cycle, the number of repetitions of charging and discharging, as input data or weighted value parameters between the plurality of hidden layers. The data analysis technique may pre-learn to estimate capacity fade in consideration of multiple degradation factors of a battery according to actual operation of the battery. In an example, the data analysis technique based on the neural network is an analysis model or a calculation model learned and generated inside or outside a BMS.

The SOH estimator 120 may input the data collected by the data collector 110 into the data analysis technique based on the neural network and may use the pre-learned data analysis technique based on the neural network to estimate the SOH of the battery in consideration of various degradation factors. For example, capacity fade of a battery may be estimated in consideration of an actual degradation level of the battery according to long-term operation of the battery, and from this, the state of the battery may more accurately be estimated.

The SOC estimator 130 estimates an SOC of the battery based on the estimated SOH of the battery. In addition, the SOC estimator 130 may estimate one or more battery states from a group consisting of a potential and a density distribution of the battery from the estimated SOH of the battery.

For example, in S730, the SOC estimator 130 may update a parameter related to an electrode of the battery from the estimated SOH of the battery. For example, the parameter related to an electrode may include parameters such as, for example, an electrode volume ratio, a film resistance, and a particle size of an electrode. The SOC estimator 130 may update the parameter related to the electrode by storing the calculated parameter related to the electrode in the parameter storage 140. In an example, the updated parameter is a value in consideration of a decrease in an SOH of a battery due to degradation of the battery. Other than the embodiment described above, various types of parameters related to an electrode may be used, without departing from the spirit and scope of the illustrative examples described.

In S740, the SOC estimator 130 may estimate the SOC of the battery based on the updated parameter. For example, the SOC estimator 130 may apply the updated parameter to the electrochemical model 150 to estimate the SOC of the battery.

Figure 8:
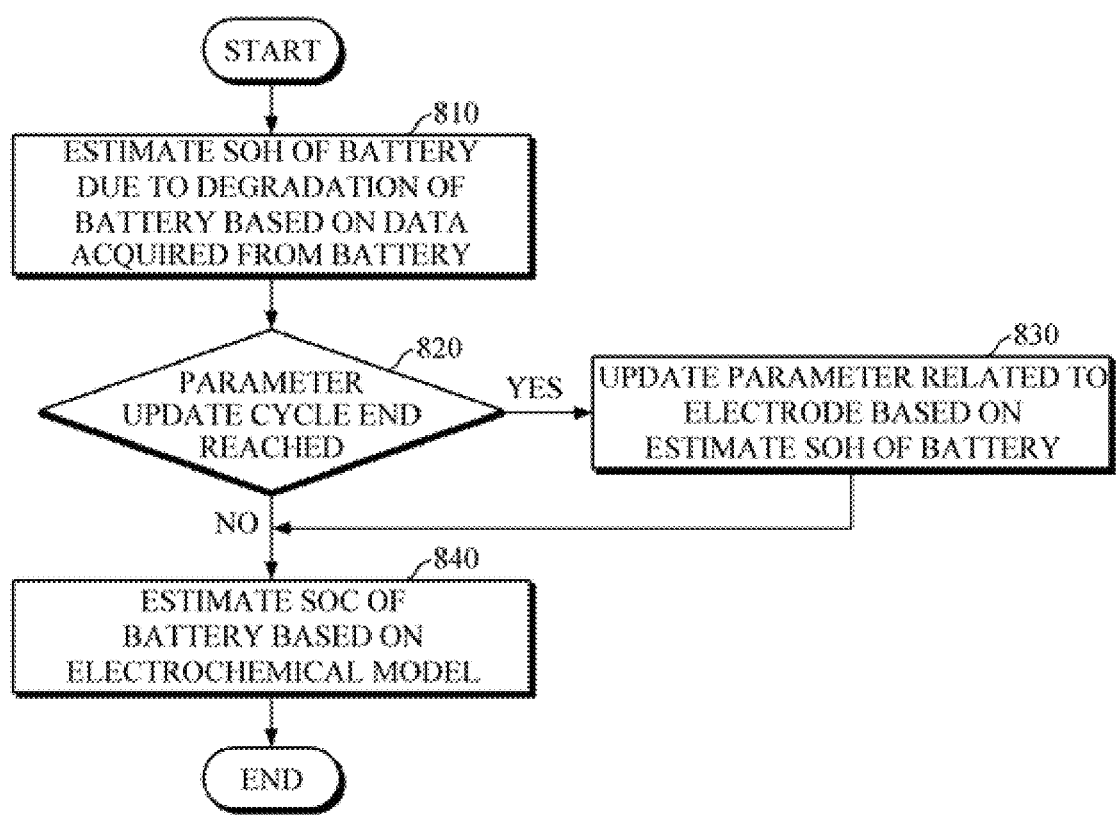
FIG. 8 is a diagram illustrating an example of a battery state estimation method based on a parameter update cycle.

FIG. 8 is a diagram illustrating an example of a battery state estimation method based on a parameter update cycle. The operations in FIG. 8 may be performed in the sequence and manner as shown, although the order of some operations may be changed or some of the operations omitted without departing from the spirit and scope of the illustrative examples described. Many of the operations shown in FIG. 8 may be performed in parallel or concurrently. In addition to the description of FIG. 8 below, the above descriptions of FIGS. 1-7, are also applicable to FIG. 8, and are incorporated herein by reference. Thus, the above description may not be repeated here.

In S810, the SOH estimator 120 estimates an SOH of a battery due to degradation of the battery based on data acquired from the battery.

In S820, the SOC estimator 130 estimates whether an end of a parameter update cycle has been reached. In an example, the length of the parameter update cycle is predetermined. For example, the SOC estimator 130 may estimate a parameter update cycle based on one or combinations of a battery capacity, a battery operation time, a charge/discharge time, and the number of charge/discharge cycles. In an example, example, the SOC estimator 130 may estimate the parameter update cycle to be a period such as, one day, one week, or one month. The SOC estimator 130 may estimate the parameter update cycle according to the number of charge/discharge cycles, and may preset the parameter update cycle by combining predetermined standards.

In S830, when the end of the parameter update cycle set according to predetermined standards has been reached, the SOC estimator 130 may update the parameter related to an electrode based on the estimated SOH of the battery. In an example, the parameter related to an electrode includes parameters, such as, for example, an electrode volume ratio, a film resistance, and a particle size of an electrode.

In S840, the SOC estimator 130 estimates a state of the battery based on the electrochemical model. For example, when the parameter related to an electrode is updated, the SOC estimator 130 may apply the updated parameter related to the electrode to the electrochemical model to estimate the SOC of the battery.

In S840, when the end of the predetermined parameter update cycle has not been reached, the SOC estimator 130 may apply a parameter stored in the parameter storage to the electrochemical model to estimate the SOC of the battery.

A decrease in the SOH of the battery due to degradation of the battery may be exhibited over a long period of time as the battery is operated, and the SOC estimator 130 may reduce an unnecessary calculation process and improve accuracy in estimating a state of the battery by predetermining an update cycle in which the parameter related to an electrode is updated according to a predetermined standard.

The battery state estimation apparatus 100, data collector 110, SOH estimator 120, SOC estimator 130, parameter storage 140, electrochemical model 150, and display 160 described in FIGS. 2-3 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 6-8 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus to estimate a state of a battery, the apparatus comprising:
   one or more sensors configured to measure data over time including any one or any combination of a voltage, a current, a temperature, a current rate, and a charge/discharge cycle of the battery; and
   a processor configured to:
      estimate a state of health (SOH) of the battery over time by inputting the measured data to an input layer of a pre-learned neural network and estimating the SOH based on an output of an output layer of the neural network;
      in response to an end of a parameter update cycle being reached, update one or more electrode parameters of the battery based on the estimated SOH; and
      estimate a state of charge (SOC) of the battery by applying the updated one or more electrode parameters to an electrochemical model of the battery.

2. The apparatus of claim 1, wherein the processor comprises:
   a state of health (SOH) estimator configured to perform the estimation of the SOH; and
   a state of charge (SOC) estimator configured to perform the estimation of the SOC.

3. The apparatus of claim 1, further comprising a data collector configured to collect the data measured by the one or more sensors.

4. The apparatus of claim 1, wherein the neural network is trained through deep learning to consider a degradation level of operation of the battery.

5. The apparatus of claim 1, wherein the one or more electrode parameters are of the electrochemical model of the battery.

6. The apparatus of claim 5, wherein the one or more electrode parameters comprises any one or any combination of an electrode volume ratio parameter, a film resistance parameter, and an electrode particle size parameter.

7. The apparatus of claim 5, wherein the parameter update cycle is determined based on any one or any combination of a battery capacity, a battery operation time, a charge/discharge time of the battery, and a number of charge/discharge cycles of the battery.

8. The apparatus of claim 5, wherein the performance of the estimation of the SOC of the battery using the electrochemical model with the updated one or more electrode parameters includes estimating a battery state comprising potential and density distribution.

9. A processor implemented method to estimate a state of a battery, the method comprising:
   measuring, using one or more sensors, data over time including any one or any combination of a voltage, a current, a temperature, a current rate, and a charge/discharge cycle of the battery;
   estimating a state of health (SOH) of the battery over time by inputting the measured data to an input layer of a pre-learned neural network and estimating the SOH based on an output of an output layer of the neural network;
   in response to an end of a parameter update cycle being reached, updating one or more electrode parameters of the battery based on the estimated SOH; and
   estimating a state of charge (SOC) of the battery by applying the updated one or more electrode parameters to an electrochemical model of the battery.

10. The method of claim 9, further comprising:
    collecting the data measured by the one or more sensors.

11. The method of claim 9, wherein the neural network is trained through deep learning to consider a degradation level of operation of the battery.

12. The method of claim 9, wherein the the parameter update cycle is determined based on any one or any combination of a battery capacity, a battery operation time, a charge/discharge time of the battery, and a number of charge/discharge cycles of the battery.

13. The method of claim 9, wherein the one or more electrode parameters are of the electrochemical model of the battery.

14. The method of claim 13, wherein the one or more electrode parameters comprises any one or any combination of an electrode volume ratio parameter, a film resistance parameter, and an electrode particle size parameter.

15. The method of claim 13, wherein the performance of the estimation of the SOC of the battery using the electrochemical model with the updated one or more electrode parameters includes estimating a battery state comprising potential and density distribution.

16. A non-transitory computer-readable storage medium storing instructions that, when executed by a processor, cause the processor to perform the method of claim 9.

17. The method of claim 9, wherein the estimating of the SOC comprises, in response to the one or more electrode parameters being updated, applying the updated one or more electrode parameters to the electrochemical model to estimate the SOC of the battery.

18. A processor implemented method to estimate a state of a battery, the method comprising:
- measuring, using one or more sensors, data including any one or any combination of a voltage, a current, a temperature, a current rate, and a charge/discharge cycle of the battery;
- inputting the measured data into an input layer of a pre-learned neural network;
- estimating a state of health (SOH) of the battery based on an output of an output layer of the neural network; and
- in response to an end of a parameter update cycle being reached, updating one or more electrode parameters of an electrochemical model and estimating a state of charge (SOC) of the battery using the electrochemical model with the updated one or more electrode parameters.

* * * * *